(12) United States Patent
Nishita et al.

(10) Patent No.: US 7,674,722 B2
(45) Date of Patent: Mar. 9, 2010

(54) METHOD OF FORMING GATE INSULATING FILM, SEMICONDUCTOR DEVICE AND COMPUTER RECORDING MEDIUM

(75) Inventors: Tatsuo Nishita, Amagasaki (JP); Shuuichi Ishizuka, Nirasaki (JP); Yutaka Fujino, Nirasaki (JP); Toshio Nakanishi, Amagasaki (JP); Yoshihiro Sato, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 51 days.

(21) Appl. No.: 11/718,292

(22) PCT Filed: Oct. 27, 2005

(86) PCT No.: PCT/JP2005/019763

§ 371 (c)(1),
(2), (4) Date: Apr. 30, 2007

(87) PCT Pub. No.: WO2006/046634

PCT Pub. Date: May 4, 2006

(65) Prior Publication Data

US 2007/0290247 A1    Dec. 20, 2007

(30) Foreign Application Priority Data

Oct. 28, 2004    (JP) .............................. 2004-313647

(51) Int. Cl.
*H01L 21/31* (2006.01)
*H01L 21/469* (2006.01)

(52) U.S. Cl. ........................ 438/770; 438/769; 438/775; 257/409; 257/411

(58) Field of Classification Search ................. 438/769, 438/770, 775, 788; 257/409, 410, 411
See application file for complete search history.

(56) References Cited

U.S. PATENT DOCUMENTS

| 2005/0176191 A1* | 8/2005 | Kumar et al. ............... 438/197 |
| 2005/0233599 A1* | 10/2005 | Sugawara et al. ........... 438/788 |
| 2006/0048857 A1* | 3/2006 | Cooper et al. ............... 148/220 |
| 2006/0228902 A1* | 10/2006 | Igeta et al. .................. 438/775 |
| 2007/0065593 A1* | 3/2007 | Wajda et al. ................. 427/532 |

FOREIGN PATENT DOCUMENTS

| JP | 10 173187 | 6/1998 |
| JP | 2002 170825 | 6/2002 |
| JP | 2002 261097 | 9/2002 |
| JP | 2002 543584 | 12/2002 |
| JP | 2004 48001 | 2/2004 |
| WO | 02 058130 | 7/2002 |
| WO | 03 088345 | 10/2003 |

* cited by examiner

*Primary Examiner*—Phuc T Dang
(74) *Attorney, Agent, or Firm*—Oblon, Spivak, McClelland, Maier & Neustadt, L.L.P.

(57) ABSTRACT

In the present invention, when a gate insulation film in a DRAM is formed, an oxide film constituting a base of the gate insulation film is plasma-nitrided. The plasma nitridation is performed with microwave plasma generated by using a plane antenna having a large number of through holes. Nitrogen concentration in the gate insulation film formed by the plasma nitridation is 5 to 20% in atomic percentage. Even without subsequent annealing, it is possible to effectively prevent a boron penetration phenomenon in the DRAM and to reduce traps in the film causing deterioration in driving capability of the device.

7 Claims, 7 Drawing Sheets

FIG.4

| PROCESS | PRE-HEATING → | PLASMA IGNITION → | POWER ADJUSTMENT → | NITRIDATION → | PLASMA TERMINATION |
|---|---|---|---|---|---|
| TIME (SEC) | 70 | 5 | 5 | × | 3 |
| PRESSURE (Pa) | 126.66 | 126.66 | 6.7 | 6.7 | 6.7 |
| N2 FLOW RATE (SCCM) | 0 | 0 | 0 | 40 | 40 |
| Ar FLOW RATE (SCCM) | 2000 | 2000 | 1000 | 1000 | 1000 |
| MICROWAVE POWER (W) | 0 | 2000 | 1500 | 1500 | 0 |

METHOD OF FORMING GATE INSULATING FILM, SEMICONDUCTOR DEVICE AND COMPUTER RECORDING MEDIUM

This application is a 371 of PCT/JP05/19763.

TECHNICAL FIELD

The present invention relates to a method of forming a gate insulation film of a semiconductor device, a semiconductor device, and a computer recording medium.

BACKGROUND ART

In a semiconductor device including a silicon oxide film as a gate insulation film, in order to prevent so-called boron penetration which is a phenomenon that boron in a gate electrode penetrates the gate insulation film made of the silicon oxide film to reach a substrate, the silicon oxide film is nitrided with plasma and thereafter is subjected to rapid thermal annealing (Patent document 1).
[Patent Document 1] Japanese Patent Application Laid-open No. 2004-48001

However, the above conventional art is an art relating to a MOSFET and requires additional annealing as post-processing. However, the annealing may possibly increase the film thickness. Therefore, there is a demand for an art which can prevent the boron penetration yet does not require the subsequent annealing even in a case where the oxide film forming the gate insulation film of other semiconductor devices, for example, a DRAM (Dynamic Random Access Memory) is processed by plasma nitriding. In this case, it is also necessary to be careful about nitrogen concentration in the oxide film which is a factor to cause deterioration in driving capability of the device.

DISCLOSURE OF THE INVENTION

Problems to Be Solved by the Invention

The present invention was made in view of the above respect, and its object is to prevent a boron penetration phenomenon in a gate insulation film yet eliminate the need for annealing after plasma nitridation, and moreover, to inhibit deterioration of driving capability of a device.

Means for Solving the Problems

To attain the above object, in a method of forming a gate insulation film of the present invention, when an oxide film forming the insulation film is plasma-nitrided with plasma generated from argon gas and nitrogen gas, the plasma nitridation is performed with microwave plasma by using a plane antenna, and the oxide film forming the gate insulation film is plasma-nitrided so as to have nitrogen concentration of 5 to 20% in atomic percentage.

In the microwave plasma nitridation using the plane antenna, a flow rate ratio of the argon gas and the nitrogen gas used as process gas for the plasma processing is appropriately 2:1 to 30:1, preferably, 2.5: 1 to 25:1, more preferably, 2.5 to 1 to 5:1.

According to the present invention, by the plasma nitridation with the microwave plasma using the plane antenna, it is possible to realize plasma nitridation with low electron temperature and high density, and it is possible to effectively prevent the boron penetration phenomenon in, for example, a DRAM even without the annealing. In addition, traps in the film causing deterioration in driving capability of the device can be reduced. A large number of through holes may be formed in the plane antenna.

Processes of the plasma nitridation may include the steps of: carrying, for example, a substrate into a process vessel; subsequently, vacuuming the inside of the process vessel to remove residual oxygen in the process vessel; subsequently heating the substrate; subsequently introducing process gas necessary for the nitridation into the process vessel; and subsequently generating the plasma in the process vessel to perform the plasma nitridation.

Further, in the present invention, for example, at the time of the plasma nitridation, it is possible to control the nitrogen concentration in the gate insulation film to a predetermined concentration by controlling process pressure and process time.

In a case where these methods are executed by a plasma processing apparatus, these methods may be stored in a computer recording medium as software for causing a controller to control the plasma processing apparatus.

According to another aspect of the present invention, the present invention is a semiconductor device including a gate electrode formed on a substrate via a gate insulation film formed of an oxynitride film, wherein the gate insulation film is the oxynitride film which is an oxide film plasma-nitrided with microwave plasma by using a plane antenna having a large number of through holes, and nitrogen concentration in the gate insulation film is 5 to 20% in atomic percentage.

According to the semiconductor device as structured above, the boron penetration phenomenon is effectively prevented and traps in the film causing deterioration in driving capability of the device are reduced.

Effect of the Invention

According to the present invention, a boron penetration phenomenon is prevented in a semiconductor device, yet annealing after plasma nitridation is not necessary, and deterioration in driving capability of the device is inhibited.

BRIEF DESCRIPTION OF THE DRAWINGS

[FIG. 4] A table showing an example of recipes for the processes of the plasma nitridation.

Explanation of Codes

| 1 | plasma processing apparatus |
|---|---|
| 2 | process vessel |
| 3 | susceptor |
| 20 | transmissive window |
| 30 | slot antenna |
| 33 | slit |
| 36 | microwave supplier |
| W | wafer |

BEST MODE FOR CARRYING OUT THE INVENTION

Figure 1:
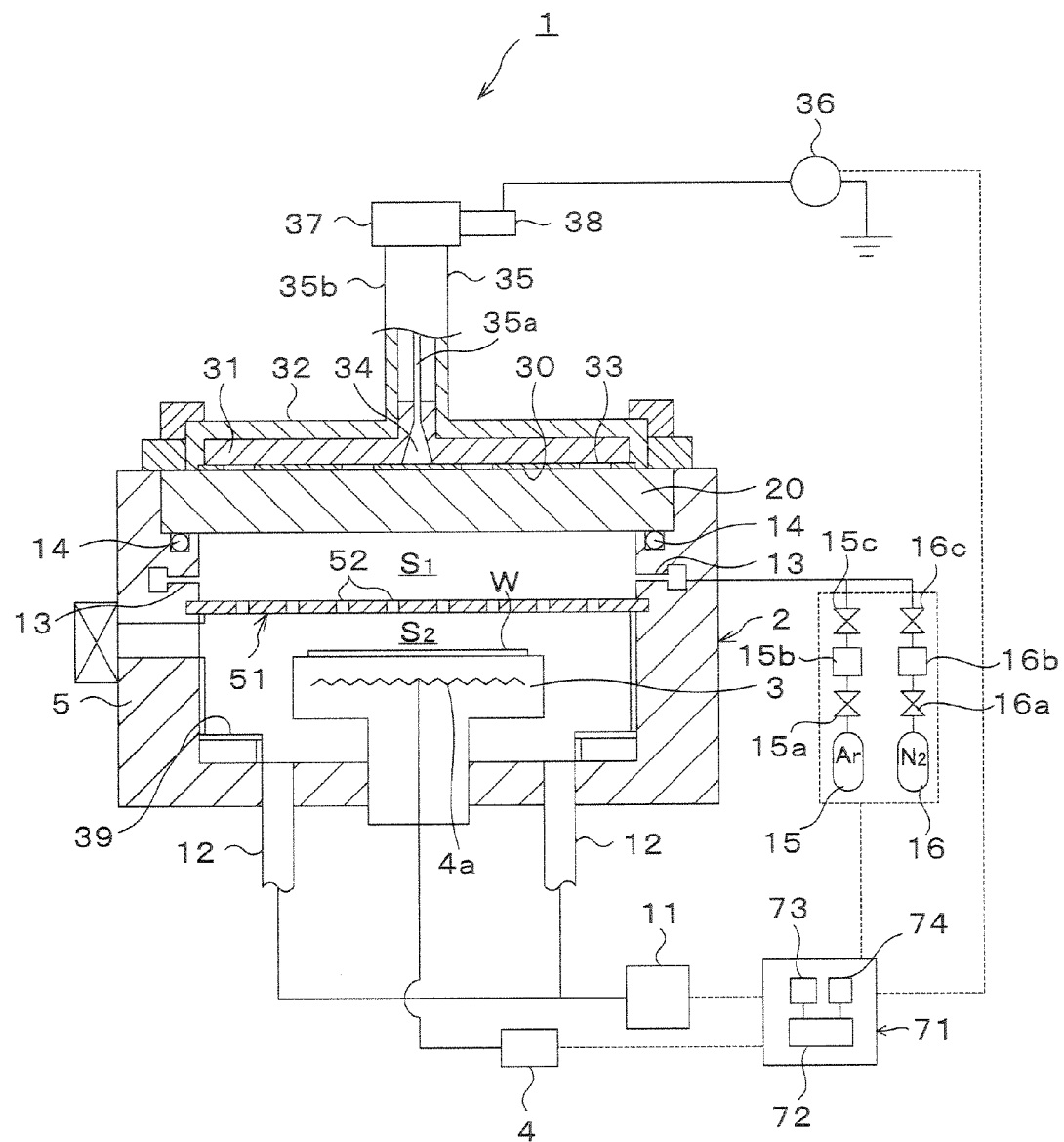
[FIG. 1] An explanatory view of a vertical cross section of a plasma processing apparatus for carrying out a method according to an embodiment.

Hereinafter, an embodiment of the present invention will be described. FIG. 1 shows the appearance of a vertical cross section of a plasma processing apparatus 1 for carrying out a method of forming a gate insulation film according to this embodiment, and this plasma processing apparatus 1 includes a process vessel 2 made of, for example, aluminum and formed in a bottomed cylindrical shape whose upper portion is open. The process vessel 2 is grounded. The process vessel 2 has in a bottom portion thereof a susceptor 3 as a mounting table for placing a substrate, for example, a semiconductor wafer (hereinafter, referred to as a wafer) W thereon. The susceptor 3 is made of, for example, aluminum nitride and has a heater 4a therein. The heater 4a can be constituted of, for example, a resistor, and generates heat when supplied with power from an AC power source 4 provided outside the process vessel 2 and is capable of heating the wafer on the susceptor 3 to a predetermined temperature.

At a bottom portion of the process vessel 2, an exhaust pipe 12 through which an atmosphere inside the process vessel 2 is exhausted by an exhaust device 11 such as a vacuum pump is provided. In a sidewall of the process vessel 2, a gas introducing part 13 for supplying process gas from a process gas supply source is provided. In this embodiment, as the process gas supply source, an argon gas supply source 15 and a nitrogen gas supply source 16 are prepared and they are connected to the gas introducing part 13 via valves 15a, 16a, massflow controllers 15b, 16b, and valves 15c, 16c, respectively.

A transmissive window 20 made of a dielectric, for example, quartz glass is provided in the upper opening of the process vessel 2 via a seal member 14 such as an O-ring for ensuring airtightness. Other dielectric material, for example, AlN, $Al_2O_3$, sapphire, SiN, or ceramics may be used instead of the quartz glass. Owing to this transmissive window 20, a processing space S is formed in the process vessel 2. The transmissive window 20 has a circular plane section.

Upper portion of the transmissive window 20, an antenna member is provided. For example, a plane slot antenna 30 in a disk shape is provided, and on an upper surface of this slot antenna 30, a dielectric retardation plate 31 and an antenna cover 32 of metal such as aluminum covering the retardation plate 31 are further provided. A cooling part for cooling the transmissive window 20, the slot antenna 30, and so on is provided in the antenna cover 32. The slot antenna 30 is constituted of a thin conductive circular or polygonal plate made of a conductive material, for example, metal such as copper or aluminum, and its surface is plated with, for example, gold or silver. The slot antenna 30 has a large number of slits 33 as through holes arranged, for example, spirally or concentrically. The shape itself of the through holes is not limited to such a slit shape but holes in any of various forms are applicable.

An inner conductor 35a made of a conductive material, for example, a conductor such as metal is connected to a center of the slot antenna 30. A slot antenna 30 side end portion of the inner conductor 35a has a conical shaped(trumpet shaped) portion 34 for efficient propagation of a microwave to the slot antenna 30. The inner conductor 35a and an outer tube 35b positioned on an outer side of the inner conductor 35a constitute a coaxial waveguide 35. For example, the microwave of 2.45 GHz generated in a microwave supplier 36 is propagated to the slot antenna 30 via a rectangular waveguide 38, a load matching device 37, the coaxial waveguide 35, and the retardation plate 31 to be supplied into the process vessel 2 via the slits 33 and the transmissive window 20. Energy thereof forms an electromagnetic field on a lower surface of the transmissive window 20 in the process vessel 2, whereby process gas supplied into the process vessel 2 through the gas introducing part 13 is uniformly turned into plasma, and the wafer W on the susceptor 3 is uniformly plasma-processed, for example, plasma-nitrided.

Further, at a position which is in an upper portion of the sidewall 5 of the process vessel 2 and under the gas introducing part 13, a shower plate 51 is horizontally disposed. The shower plate 51 is made of a dielectric, for example, a quartz material and has a large number of through holes 52 formed uniformly in its surface. The shower plate 51 partitions the processing space in the process vessel 2 into an upper processing space S1 and a lower processing space S2. The shower plate 51 traps ions generated in the upper processing space S1 and is capable of passing only radicals therethrough. This can reduce ion damage.

A quartz liner 39 is provided on an inner wall surface of the process vessel 2, so that it is possible to prevent metal contamination from occurring from the inner wall surface of the process vessel 2 due to sputtering by ions or the like when the plasma is generated in the process vessel 2, and a clean environment is formed in the process vessel 2. Consequently, it is possible to carry out the nitriding process to the substrate without any impurities mixed in the device.

The plasma processing apparatus 1 as structured above is controlled by a controller 71 The controller 71 has a central processing unit 72, a support circuit 73, and a storage medium 74 containing related control software. The controller 71 controls, for example, the supply, stop, flow rate adjustment of gas from the nozzle 13, temperature adjustment of the heater 4a, the exhaust by the exhaust device 11, further the microwave supplier 36, and so on, and performs control necessary in processes of the plasma processing performed by the plasma processing apparatus 1.

As the central processing unit 72 of the controller 71, a processor of a general-purpose computer is usable. As the storage medium 74, usable is a storage medium of any of various types such as, for example, a RAM, a ROM, a flexible disk, a hard disk, a MO, or a DVD. Further, the support circuit 73 is connected to the central processing unit 72 to support the processor in various ways.

The plasma processing apparatus 1 has the above-described structure, and to carry out plasma nitridation processing of the wafer W on whose surface a silicon oxide film has been formed by another oxidation apparatus, the wafer W is placed on the susceptor 3 in the process vessel 2, and while predetermined process gas, for example, mixed gas of argon gas/nitrogen gas is supplied into the process vessel 2 through the gas introducing part 13, the inside of the processing space S is exhausted through the exhaust pipe 12, so that the pressure therein is set to a predetermined pressure. Then, the wafer W is heated to a predetermined temperature by the heater 4a, the microwave is generated by the microwave supplier 36, an electromagnetic field is generated on the lower surface of the transmissive window 20 in the processing space S to turn the process gas into plasma, whereby the silicon oxide film on the wafer W is processed by plasma nitriding. In addition, the plasma generated from the process gas by the energy of the microwave supplied via the slot antenna 30 is plasma with low-electron temperature and high density, and under this plasma, the entire wafer W can be uniformly processed by plasma nitriding, and the wafer suffers no plasma damage, which is effective.

Figure 2:
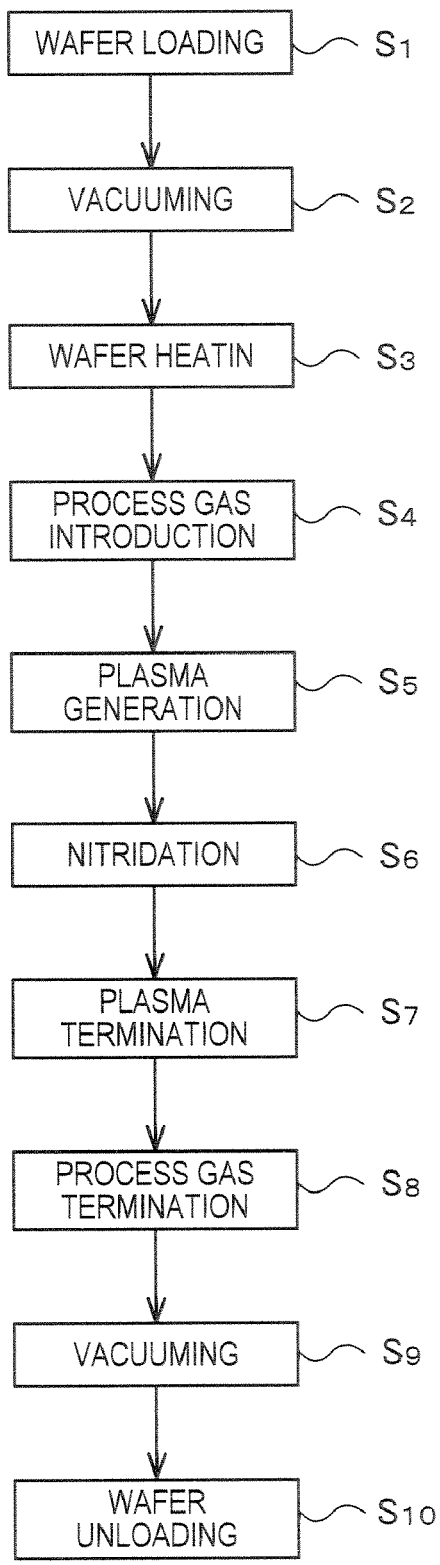
[FIG. 2] A flowchart of processes of plasma nitridation according to the embodiment.

Processes of the aforesaid plasma nitridation processing will be described in detail based on FIG. 2 and FIG. 3. The wafer W is carried into the process vessel 2 to be placed on the susceptor 3 (Step S1). Then, the exhaust device 11 is operated to vacuum the inside of the process vessel 2, thereby removing residual oxygen in the process vessel 2 (Step S2). Thereafter, the heater 4a heats the wafer W to the predetermined temperature (Step S3). Then, the process gas, that is, the argon gas and the nitrogen gas, is introduced into the process vessel 2 through the gas introducing part 13 (Step S4). The microwave supplier 36 is operated to turn the process gas in the process vessel 2 into plasma (Step S5), whereby predetermined plasma nitridation is performed (Step S6).

Figure 3A:
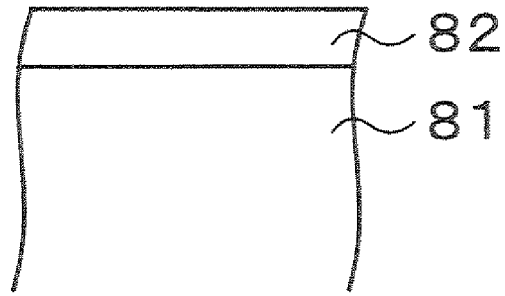
[FIG. 3] Explanatory views showing states of a silicon oxide film when the silicon oxide film is processed by plasma nitriding.
Figure 3C:
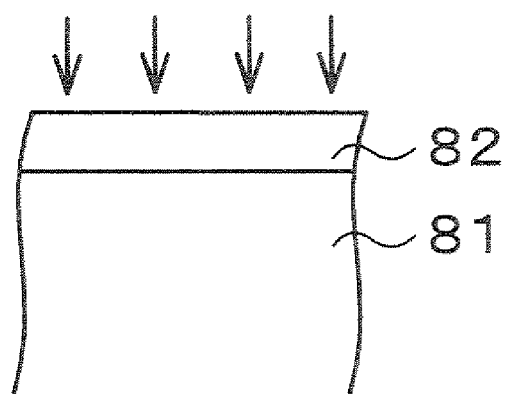
Figure 3B:
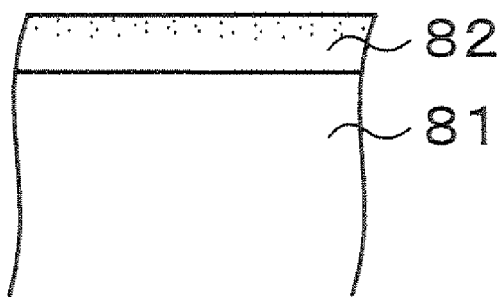

When the plasma nitridation is performed, a silicon oxide film 82 formed on a substrate 81 shown in FIG. 3(A) is nitrided by nitrogen radicals generated by the plasma as shown in FIG. 3(B), and as a result, for example, the silicon oxide film 82 can be nitrided so as to have high nitrogen concentration on its front surface side, as shown in FIG. 3(C). Further, it is possible to accurately control the nitrogen concentration by controlling the pressure and time.

Then, after a predetermined process time has passed, the supply of the microwave is stopped to stop the plasma (Step S7). Then, the supply of the process gas is stopped (Step S8). The exhaust device 11 vacuums the inside of the process vessel 2 to discharge residual gas and so on (Step S9). Thereafter, the wafer W is carried out of the process vessel 2 (Step S10).

As for a preferable range of the plasma, the electron temperature of the plasma is controlled to 2 eV or lower, more preferably, 0.7 eV to 1.5 eV. The plasma density is controlled to $10^{11}$ to $10^{13}$ cm$^{-3}$.

Preferably, the pressure in the processing space S is 1 to 66.65 Pa, more preferably, 7 to 12 Pa, the temperature of the wafer W is 100 to 600° C., more preferably, 200° C. to 400° C., and a power output of the microwave supplier 36 is 500 to 5000 W, more preferably, 1000 to 2000 W.

FIG. 4 shows an example of recipes for the processes of the plasma nitridation processing based on the above. First, in the step of heating the wafer W, the argon gas is supplied into the process vessel 2 at a flow rate of 2000 SCCM, the pressure in the process vessel 2 is adjusted to 126.66 Pa, and the wafer W is heated for 70 seconds.

In the subsequent plasma ignition (generation) step, the pressure in the process vessel 2 is set to, for example, 126.66 Pa, preferably, is set equal to or higher than the pressure for the nitridation, and the flow rate of gas for plasma ignition, for example, the argon gas is set to 2000 SCCM, preferably, is set equal to or higher than a flow rate for the nitridation, and the microwave of 2000 W power is supplied to the slot antenna 30. By thus setting the pressure and the flow rate of the argon gas in this step higher than those for the nitridation, it is possible to easily ignite the plasma and stably generate the plasma. For example, this process is continued for 5 seconds, preferably for 1 to 10 seconds. Another gas usable as the gas for plasma ignition is rare gas such as Kr, Xe, He, or the like.

Next, the pressure in the process vessel 2 is reduced to 6.7 Pa, the flow rate of the argon gas is reduced to 1000 SCCM, and the power for plasma is lowered to 1500 W. At this stage, the conditions are adjusted to those for the nitridation processing to be stabilized. This process is continued for 5 seconds.

Then, while the 6.7 Pa pressure in the process vessel 2, the 1500 W power for plasma, and the 1000 SCCM flow rate of the argon gas are maintained, the nitrogen gas is supplied at a flow rate of 40 SCCM and the plasma nitridation is performed for a predetermined time. Then, after the nitridation, the power of the microwave is turned off, the supply of the argon gas and the nitrogen gas is stopped, and the inside of the process vessel is vacuumed. Preferable gas flow rates in the nitridation step are 500 to 3000 SCCM for the argon gas and 5 to 1000 SCCM for the nitrogen gas. A flow rate ratio of the nitrogen gas/the argon gas is preferably 0.0016 to 2, and a ratio of the nitrogen gas to the total gas flow rate is preferably 0.0016 to 0.67, when the total gas flow rate is defined as 1.

Figure 5:
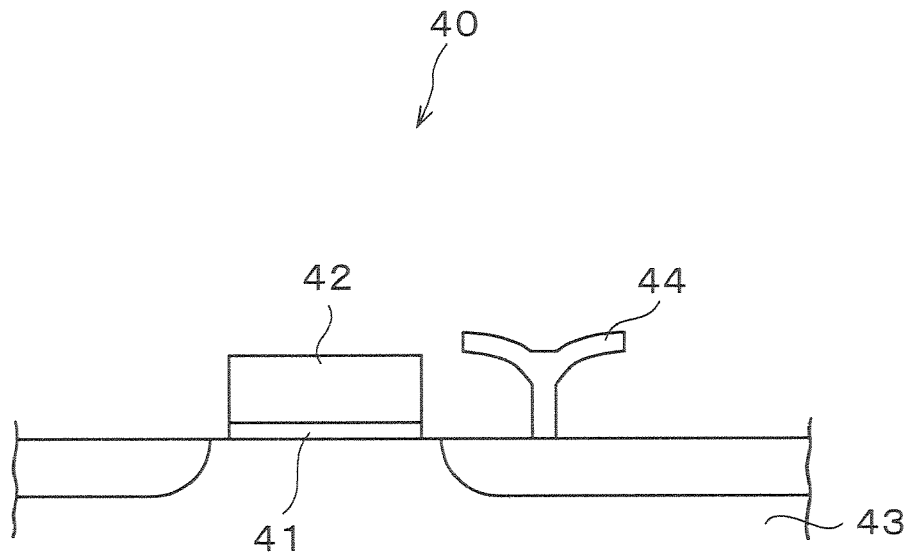
[FIG. 5] An explanatory view roughly showing the structure of a DRAM according to the embodiment.

Next, device characteristics and so on obtained when, in forming a gate insulation film 41 of a DRAM 40 shown in FIG. 5, a silicon oxide film forming the gate insulation film 41 is plasma-nitrided according to the method of the present invention will be described. In FIG. 5, 42 denotes a gate electrode, 43 denotes a silicon substrate, and 44 denotes a capacitor part.

Figure 6:
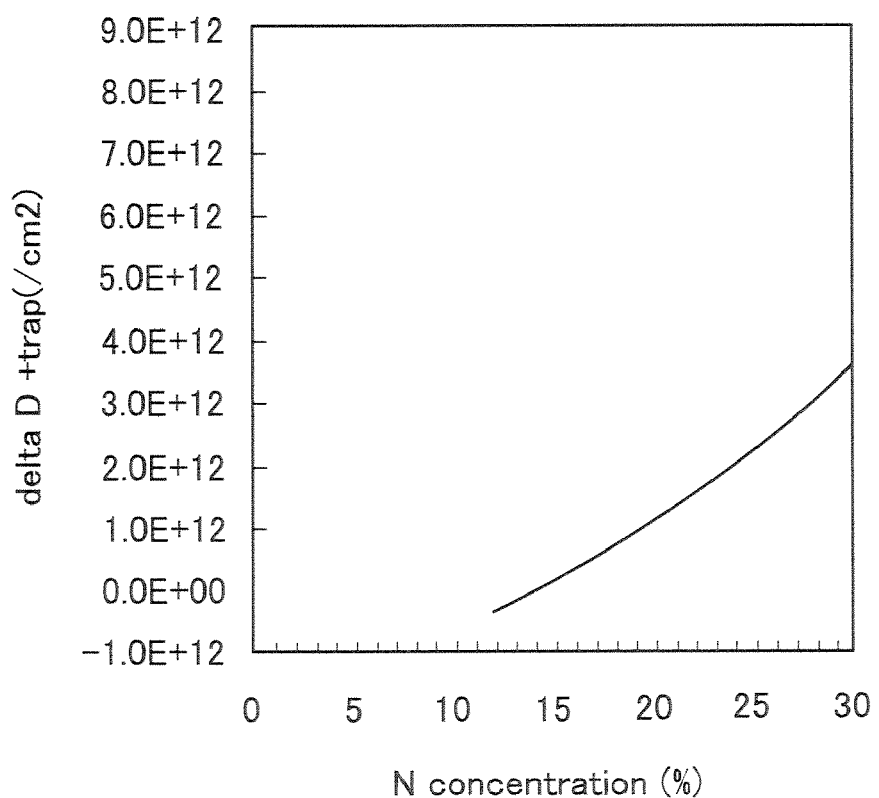
[FIG. 6] A graph showing the correlation between delta D and nitrogen atomic concentration (Atomic %) in an insulation film formed according to the present invention.

FIG. 6 shows the correlation between nitrogen atomic concentration (Atomic %) in the gate insulation film 41 having undergone the plasma nitridation according to the present invention and delta D (the number of traps/cm$^2$ at which a Vt threshold value in the film starts to shift), and shows data when the plasma nitridation is performed under varied flow rates of the argon gas and the nitrogen gas used as the process gas and varied pressure in the processing space S. The conditions of the nitridation are as follows: the flow rates of the argon gas/the nitrogen gas are 500 to 3000/5 to 1000 (SCCM); the pressure is 1 to 66.65 Pa; the temperature of the wafer W is 400° C. for all the cases; and the power of the microwave supplier 36 is 2000 W.

From the result, it has been confirmed that, when the nitrogen atomic concentration (Atomic %) is adjusted to 12.5 to 20%, the delta D can be controlled to 1.0 E+12 or less, and in this range, an increase in electron traps in the film can be most inhibited. Incidentally, a thickness of the silicon oxide film at this time is 21 to 40 angstroms.

Figure 7:
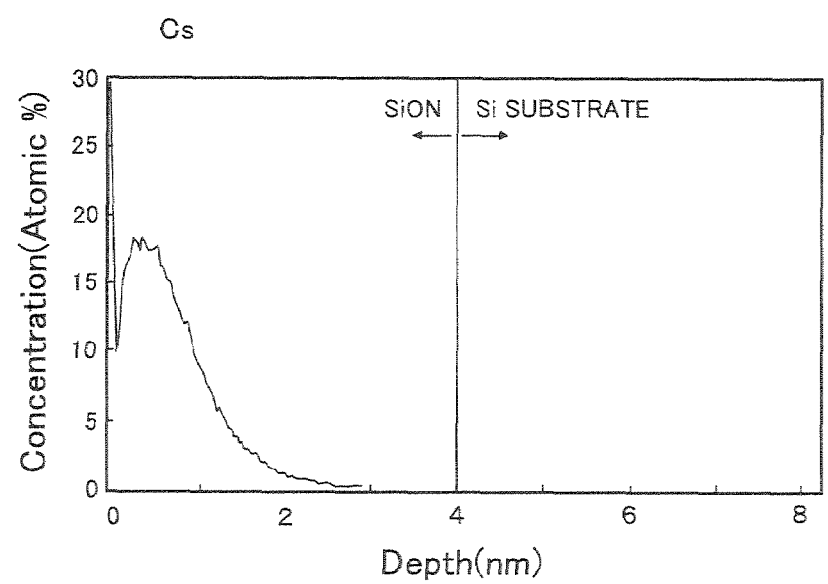
[FIG. 7] A graph showing nitrogen atomic concentration in a depth direction in the insulation film formed according to the present invention.

FIG. 7 shows nitrogen atomic concentration distribution in a depth direction of the film. FIG. 7 shows SIMS data showing the nitrogen atomic concentration (Atomic %) at positions along the depth direction in the gate insulation film 41. This data shows that a peak of high-concentration nitrogen exists on the surface side (electrode side) of the gate insulation film. This is because the plasma processing is performed at low temperature and is capable of controlling the nitrogen distribution toward the surface side. Further, it is possible to realize the nitridation which hardly causes diffusion of nitrogen to an interface and thus is capable of controlling the interface. From this, a high effect of preventing leakage current and a high effect against boron penetration have been confirmed.

Figure 8:
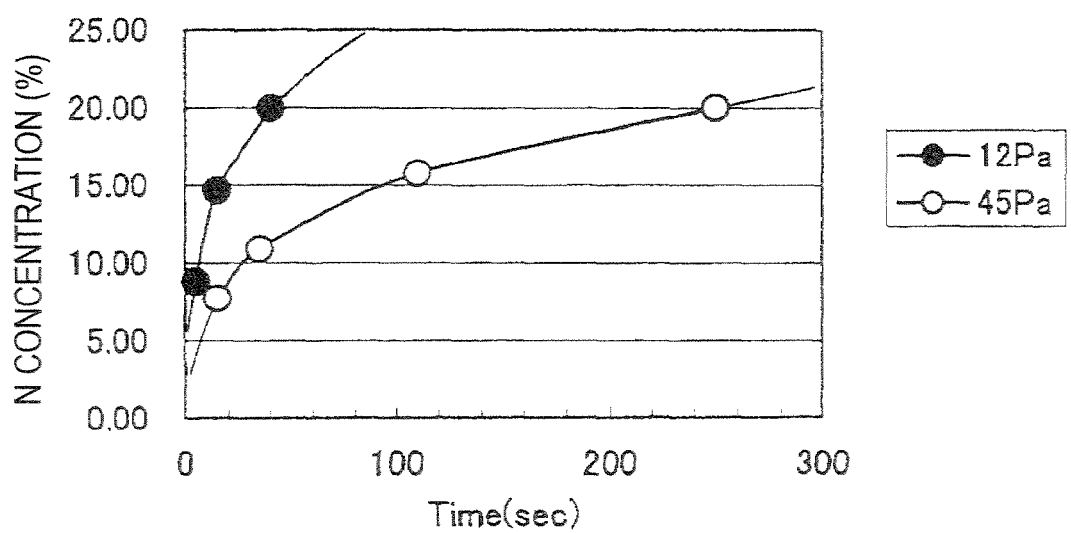
[FIG. 8] A graph showing the correlation between process time and nitrogen concentration in the silicon oxide film under varied process pressures at the time of the plasma nitridation.

Further, controlling the pressure and process time for the plasma nitridation can also control the nitrogen concentration in the insulation film. FIG. 8 shows results verified by the present inventors.

A target insulation film is a silicon oxide film with a 3 nm thickness formed by heat treatment in a water vapor atmosphere (a thermal oxide film formed by WVG: Water Vapor Generation method). Conditions for the plasma nitridation are as follows:
(1) when the pressure in the process vessel 2 is 12 Pa,
Ar/N2=1000/200 SCCM
power of the microwave: 1200 W
temperature of the wafer: 400° C.
(2) when the pressure in the process vessel 2 is 45 Pa,
Ar/N2=1000/200 SCCM
power of the microwave: 1800 W
temperature of the wafer: 400° C.

Under the above conditions, the wafer was plasma-nitrided, and the correlation between process time and nitrogen concentration in the nitrided silicon oxide film is shown in FIG. 8. As is seen, under the 12 Pa process pressure, the nitrogen concentration was 8.85, 14.67, and 19.95 (atomic %) respectively when the process time was 5 seconds, 15 seconds, and 40 seconds. Under the 45 Pa process pressure, the nitrogen concentration was 7.74, 10.90, 15.77, and 20.02 (atomic %) respectively when the process time was 15 seconds, 35 seconds, 110 seconds, and 250 seconds.

According to the above results, to increase the nitrogen concentration, it takes a short time under the 12 Pa process pressure, and more time is required under the 45 Pa process pressure. For example, to increase the nitrogen concentration up to about 20 (atomic %), the required time under 45 Pa is six times as long as that under 12 Pa. A possible reason for this is that under low pressure, ion density is higher and moving velocity of electrons is higher, which causes a larger amount of nitrogen ions than radicals are accelerated to be introduced into the oxide film, while under high pressure, ion density is lower and moving velocity of electrons is lower, so that an amount of the nitrogen ions introduced into the oxide film becomes smaller than that under the low pressure.

Therefore, by appropriately adjusting the process time and process pressure for the plasma nitridation processing, it is possible to accurately control the nitrogen concentration in the nitrided oxide film. Specifically, the process time is preferably adjusted to 1 to 280 seconds and the process pressure is preferably adjusted to 1 to 66.65 Pa, and under these conditions, it is possible to control the nitrogen concentration to a range from 1 to 30 atomic %.

By optimally controlling the nitrogen concentration in the insulation film, it is possible to prevent the penetration of a dopant from the substrate, resulting in improved device characteristics.

Further, gate insulation films of a DRAM and a logic device have become thinner, and in a case where a gate insulation film of a semiconductor device is nitrided, a conventional art has a problem that due to the thickness reduction, nitrogen diffuses to a Si/SiON interface when the gate insulation film is nitrided, so that interface roughness and the like cannot be controlled and leakage current increases. In this respect, according to the present invention, nitrogen does not diffuse to the interface as described above, so that high-concentration nitrogen can be introduced to the surface side of the film. Therefore, also from this viewpoint, it is possible to inhibit deterioration in capability of the device.

Further, in the above-described plasma processing apparatus 1, the shower plate 51 is used, and allows only radicals to pass therethrough after trapping ions, and according to the findings by the present inventors, it has been confirmed that the use of such a shower plate 51 contributes to the introduction of high-concentration nitrogen to the front surface side.

Figure 9:
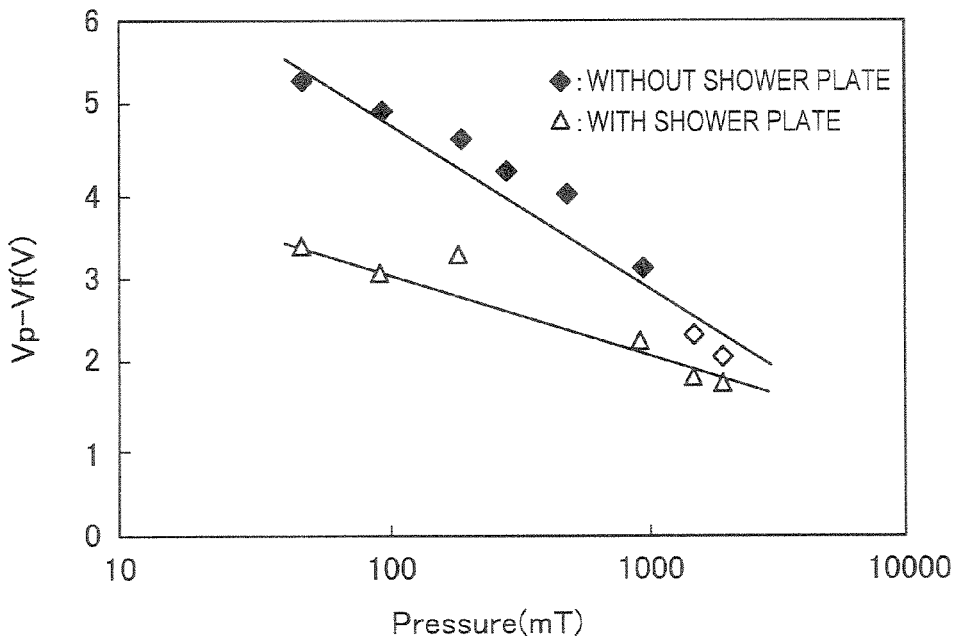
[FIG. 9] A graph showing the correlation between pressure vs plasma potential when a shower plate is provided and when the shower plate is not provided.

First, FIG. 9 shows the correlation between pressure in the process vessel and plasma potential-floating potential (Vp-Vf) when the wafer W was plasma-nitrided for 10 seconds to 20 seconds while, for example, nitrogen concentration in the oxide film was adjusted to 11% (atomic %) under the setting of 2 kW power of the microwave, 1000/40 sccm flow rate of argon gas/nitrogen gas, and 400° C. temperature of the wafer W, and the correlation when the shower plate 51 was not provided and the correlation when the shower plate 51 was provided are both shown. When the plasma sheath potential is set to fall within a range from, for example, 3.0 to 3.5 (V), the pressure in the process vessel 2 is set to about 950 mTorr when the shower plate 51 is not provided, and is set to about 50 mTorr when the shower plate 51 is provided. In this case, as for the plasma sheath potential, since energy of Si—N bond is 3.5 eV when a SiO$_2$ film is nitrided to be turned to SiN, the plasma sheath potential with energy equal to or higher than this value dissociates the generated SiN again, and therefore, sheath voltage lower than 3.5 eV, which is the Si—N bond energy is preferable.

Here, to equalize the conditions of plasma potential both in the case of the absence of the shower plate 51 and in the case of the presence of the shower plate 51 the oxide film of the wafer W was plasma-nitrided under the following common plasma conditions, except in that the pressure in the process vessel 2 was set to about 950 mTorr in the case of the absence of the shower plate 5 and the pressure in the process vessel 2 was set to about 50 mTorr in the case of the presence of the shower plate 51, and ratios of SiO and SiN in the insulation film was examined along the depth direction of the insulation film in each of the cases.

flow rate of the argon gas/nitrogen gas: 1000/40 sccm
power of the microwave: 1500 W
temperature of the wafer: 400° C.

Figure 10:
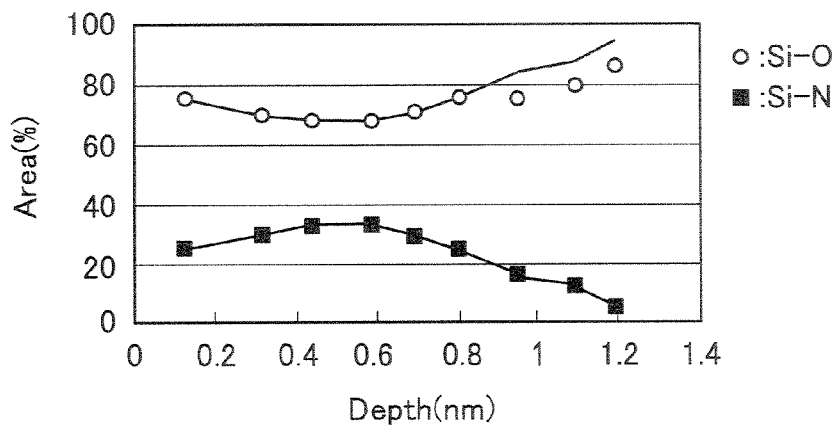
[FIG. 10] A graph showing ratios of SiO and SiN at positions along the depth direction of the insulation film when the shower plate is not provided.

As a result, results shown in FIG. 10 were obtained when the shower plate 51 was not provided. FIG. 10 shows ratios of SiO and SiN at positions along the depth direction of the gate insulation film formed by the plasma nitridation processing. Therefore, the addition of the both gives 100%. As is seen, at depths up to 0.9 nm from the surface side of the insulation film, a ratio of SiN is about 35% which is about half a ratio of SiO.

Figure 11:
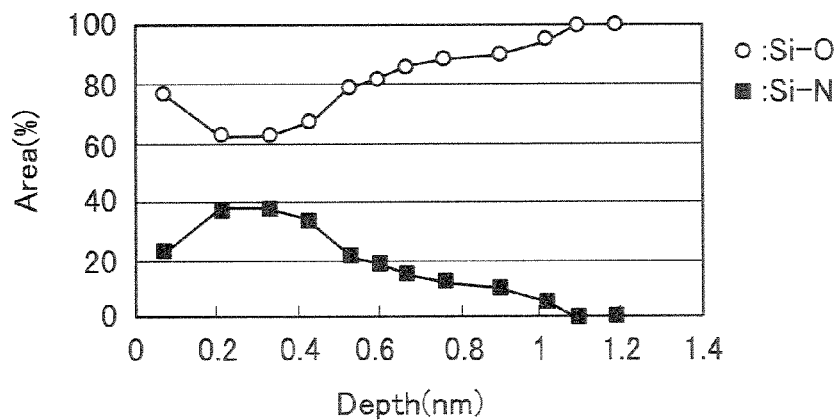
[FIG. 11] A graph showing ratios of SiO and SiN at positions along the depth direction of the insulation film when the shower plate is provided.

On the other hand, when the shower plate 51 was provided, results shown in FIG. 11 were obtained. As is seen, at depths up to about 0.2 to 0.4 nm from the surface side of the insulation film, a ratio of SiN is about 40%, and therefore, Such characteristic is obtained that a SiN ratio is high on a side closer to the surface side than when the shower plate 51 is not provided. That is, it is possible to introduce nitrogen with higher concentration to a side closer to the surface side than when the shower plate 51 is not provided.

It should be noted that the present invention is also applicable to insulation films of semiconductor devices with a stacked cell structure and logic devices such as a flash memory In a case of a DRAY, nitrogen concentration is preferably 10 to 20% in atomic percentage, and a thickness of the oxide film is preferably 20 to 40 angstroms, and in a case of a logic device, nitrogen concentration is preferably 5 to 15% in atomic percentage and a thickness of the oxide film is preferably 10 to 20 angstroms. In the above-described examples, the thermal oxide film is used as the insulation film, but it should be noted that as the insulation film to be plasma-nitrided, also usable are an oxide film which is formed by plasma-nitriding a Si substrate with plasma generated from mixed gas of Ar gas and oxygen gas by using the above-described plasma processing apparatus 1, and oxide films which are formed by plasma oxidation in plasma apparatuses using other plasma, for example, ECR plasma, magnetron plasma, ICP plasma, parallel plate-type plasma, surface reflection wave plasma, and the like. Further, besides the microwave plasma in the above-described embodiment, various kinds of plasma, for example, ECR plasma, magnetron plasma, ICP plasma, parallel plate-type plasma, surface reflection wave plasma, and the like can be used as a plasma source for the plasma nitridation.

INDUSTRIAL APPLICABILITY

The present invention is useful for nitriding a gate insulation film of a semiconductor device

What is claimed is:

1. A method of forming a gate insulation film, comprising:
    processing of plasma nitridation to an oxide film of the insulation film by microwave plasma generated from a process gas of argon gas and nitrogen gas, using a plane antenna,
    wherein the oxide film is processed by plasma nitridation so as to have nitrogen concentration of 5 to 20% in atomic percentage,
    wherein processes of the plasma nitridation comprise the steps of:
    carrying a substrate into a process vessel;
    subsequently vacuuming the inside of the process vessel to remove residual oxygen in the process vessel;
    subsequently heating the substrate;
    subsequently introducing the process gas necessary for a nitridation into the process vessel; and
    subsequently generating the plasma in the process vessel to perform the processing of plasma nitridation, and
    wherein said step of generating the plasma in the process vessel to perform the plasma nitridation processing includes the step of
    igniting the plasma, with pressure in the process vessel set higher than pressure for the plasma nitridation processing and with a flow rate of the argon gas set higher than a flow rate of the argon gas at the time of the plasma nitridation processing.

2. The method of forming the gate insulation film according to claim 1,
    wherein a thickness of the oxide film is 10 to 40 angstroms.

3. The method of forming the gate insulation film according to claim 1,
    wherein a flow rate ratio of the argon gas and the nitrogen gas is 2:1 to 30:1.

4. The method of forming the gate insulation film according to claim 1,
    wherein process pressure and process time are controlled in the processing of plasma nitridation to control the nitrogen concentration in the gate insulation film to a predetermined concentration.

5. The method of forming the gate insulation film according to claim 1,
    wherein plural holes are formed in the plane antenna.

6. The method of forming the gate insulation film according to claim 1,
    wherein pressure at the time of the plasma nitridation is 1 to 66.65 Pa.

7. A computer recording medium containing software for causing a plasma processing apparatus to execute a method of forming a gate insulation film,
    wherein the method of forming the gate insulation film comprises:
    processing of plasma nitridation to an oxide film of the insulation film by microwave plasma generated from a process gas of argon gas and nitrogen gas, using a plane antenna,
    wherein the oxide film is processed by plasma nitridation so as to have nitrogen concentration of 5 to 20% in atomic percentage,
    wherein processes of the plasma nitridation comprise the steps of:
    carrying a substrate into a process vessel;
    subsequently vacuuming the inside of the process vessel to remove residual oxygen in the process vessel;
    subsequently heating the substrate;
    subsequently introducing the process gas necessary for a nitridation into the process vessel; and
    subsequently generating the plasma in the process vessel to perform the processing of plasma nitridation, and
    wherein said step of generating the plasma in the process vessel to perform the plasma nitridation processing, includes the step of
    igniting the plasma, with pressure in the process vessel set higher than pressure for the plasma nitridation processing and with a flow rate of the argon gas set higher than a flow rate of the argon gas at the time of the plasma nitridation processing.

* * * * *